US011750208B2

(12) United States Patent
Sou et al.

(10) Patent No.: US 11,750,208 B2
(45) Date of Patent: Sep. 5, 2023

(54) ANALOGUE-TO-DIGITAL CONVERTER (ADC)

(71) Applicant: PRAGMATIC PRINTING LTD., Sedgefield (GB)

(72) Inventors: Antony Sou, Sedgefield (GB); Adrian Bratt, Sedgefield (GB)

(73) Assignee: PRAGMATIC PRINTING LTD., Sedgefield (GB)

( * ) Notice: Subject to any disclaimer, the term of this patent is extended or adjusted under 35 U.S.C. 154(b) by 56 days.

(21) Appl. No.: 17/600,684

(22) PCT Filed: Mar. 17, 2020

(86) PCT No.: PCT/GB2020/050685
§ 371 (c)(1),
(2) Date: Oct. 1, 2021

(87) PCT Pub. No.: WO2020/208333
PCT Pub. Date: Oct. 15, 2020

(65) Prior Publication Data
US 2022/0173748 A1    Jun. 2, 2022

(30) Foreign Application Priority Data

Apr. 8, 2019 (GB) .................................. 1904931

(51) Int. Cl.
*H03M 1/34* (2006.01)
*H03M 1/52* (2006.01)
(52) U.S. Cl.
CPC ............... *H03M 1/34* (2013.01); *H03M 1/52* (2013.01)
(58) Field of Classification Search
CPC .................................. H03M 1/34; H03M 1/52
(Continued)

(56) References Cited
U.S. PATENT DOCUMENTS 4,034,364 A    7/1977 Fukuda et al.
4,178,585 A  * 12/1979 Takagi .................. H03M 1/403
341/172
(Continued)

FOREIGN PATENT DOCUMENTS
SU        970683 A2    10/1982

OTHER PUBLICATIONS

International Search Report for International Application No. PCT/GB2020/050685, dated Jun. 8, 2020.
(Continued)

*Primary Examiner* — Khai M Nguyen
(74) *Attorney, Agent, or Firm* — Jason H. Vick; Sheridan Ross, PC

(57) ABSTRACT

There is provided a dual-slope analog-to-digital converter (ADC), comprising an input signal terminal, configured to provide an analog signal, and a reference signal terminal, configured to provide a predetermined reference signal. The ADC further comprises an integrator, that is operatively coupled to said input signal terminal and said reference signal terminal via a first switch unit, said first switch unit being configured to selectively connect and disconnect said integrator to and from any one of said input signal terminal and said reference signal terminal. In addition, a voltage supply is operatively coupled to said integrator and configured to selectively provide at least one first supply voltage to said integrator via a second switch unit, a comparator is operatively coupled to an output of said integrator at a first comparator input and a predetermined threshold voltage at a second comparator input, configured to provide an actuation signal at a comparator output in accordance with a predetermined comparator logic, and a controller is adapted to control any one of said first switch unit and said second switch unit. The ADC is further adapted to provide a first
(Continued)

(a)

(b)

voltage to said integrator from said voltage supply, so as to integrate over a first time period a first current corresponding to one of said reference signal and said analog signal, and, following said first time period, to provide a second voltage to said integrator from said voltage supply, so as to integrate over a second time period a second current corresponding to the other one of said reference signal and said analog signal, in order to generate a digital output signal corresponding to said analog signal, and wherein said first current and said second current flow in the same direction during respective said first time period and said second time period.

17 Claims, 7 Drawing Sheets

(58) Field of Classification Search
USPC .................................................. 341/158, 166
See application file for complete search history.

(56) References Cited

U.S. PATENT DOCUMENTS 4,368,457 A * 1/1983 Tsukada .............. H03M 1/1295
   341/124
8,144,047 B2 * 3/2012 Lin ........................ H03M 1/52
   341/166

OTHER PUBLICATIONS

Written opinion for International Application No. PCT/GB2020/050685, dated Jun. 8, 2020.
Search Report Under Section 17(5) for Great Britain Application No. 1904931.1, dated Sep. 2, 2019.
Examination Report Under Section 18(3) for Great Britain Application No. 1904931.1, dated Aug. 1, 2022.
International Preliminary Report on Patentability for International Application No. PCT/GB2020/050685, dated Oct. 21, 2021.
Hwang, Jun Young et al. "Analog-to-Digital Converter with Oxide Thin-Film Transistors" Journal of Information Display, 17:2, 79-85, (2016); DOI: 10.1080/15980316.2016.1178184.

* cited by examiner

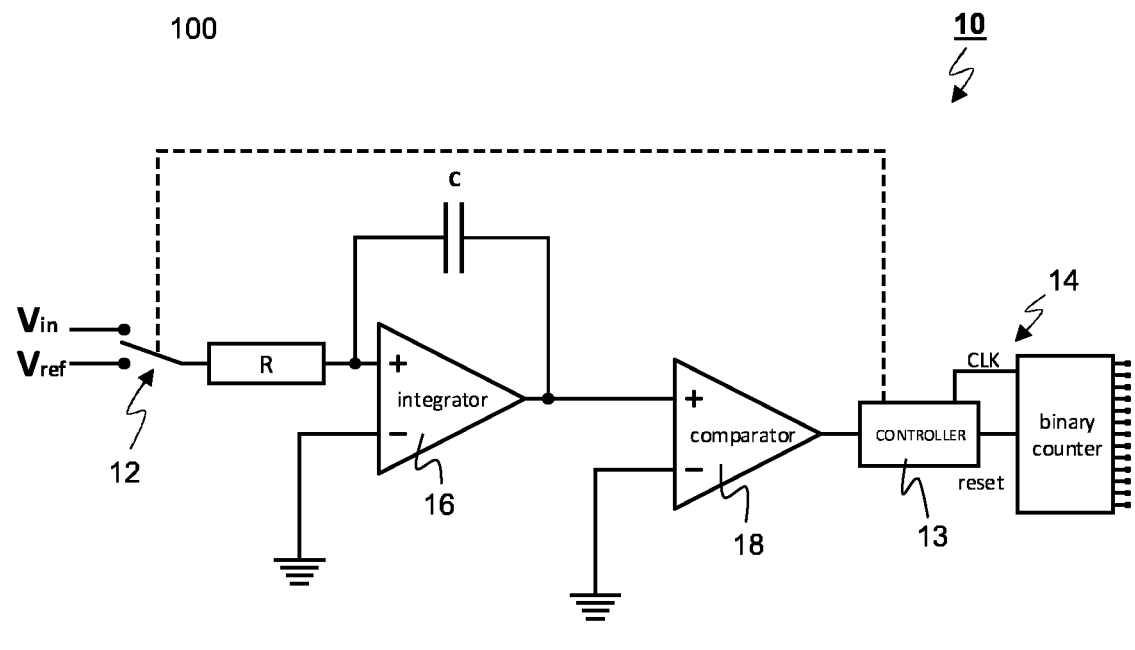
(a)
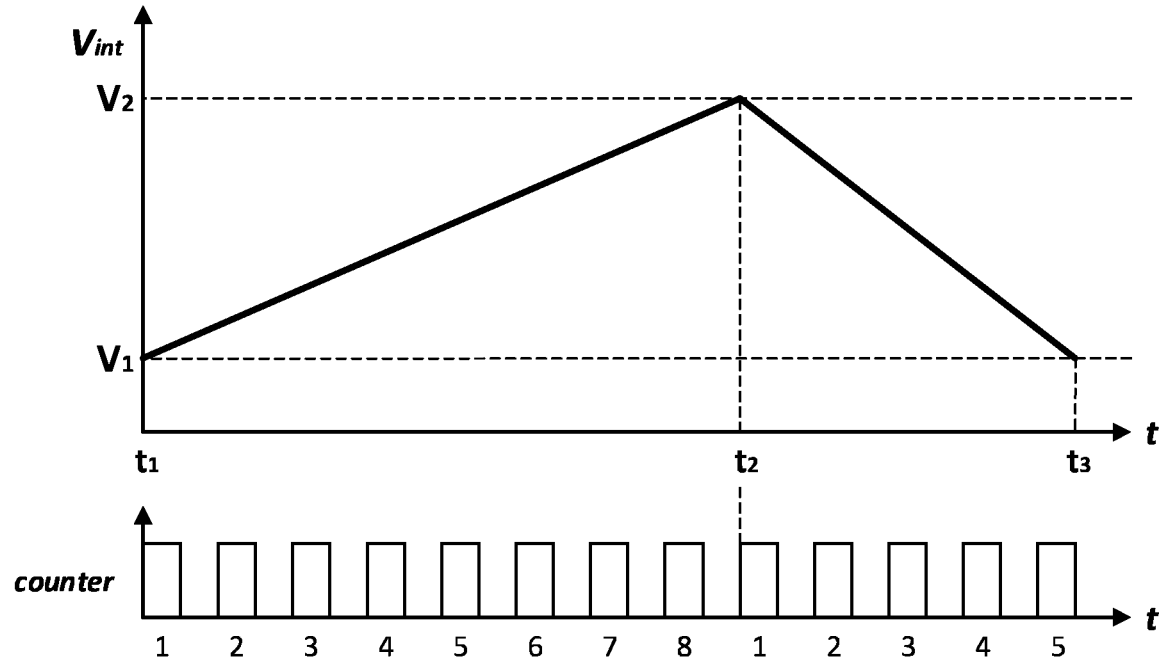
(b)
FIG. 1 *(PRIOR ART)*

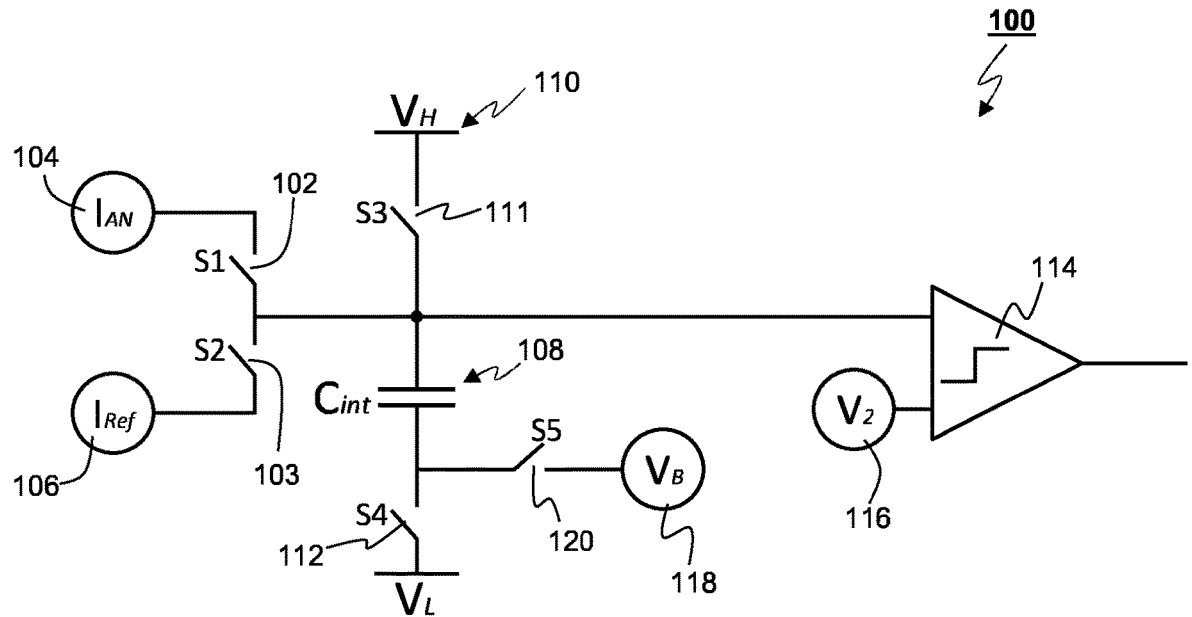
(a)
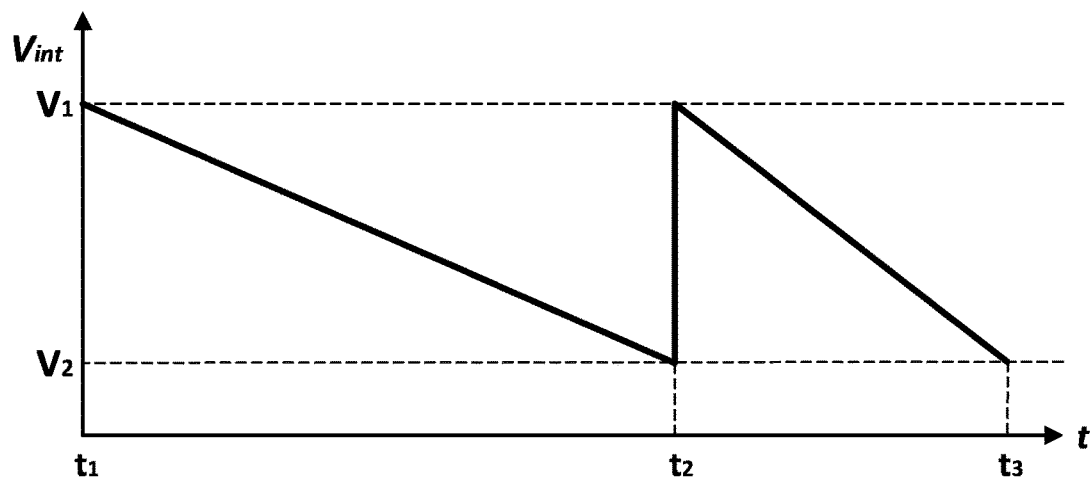
(b)
FIG. 2

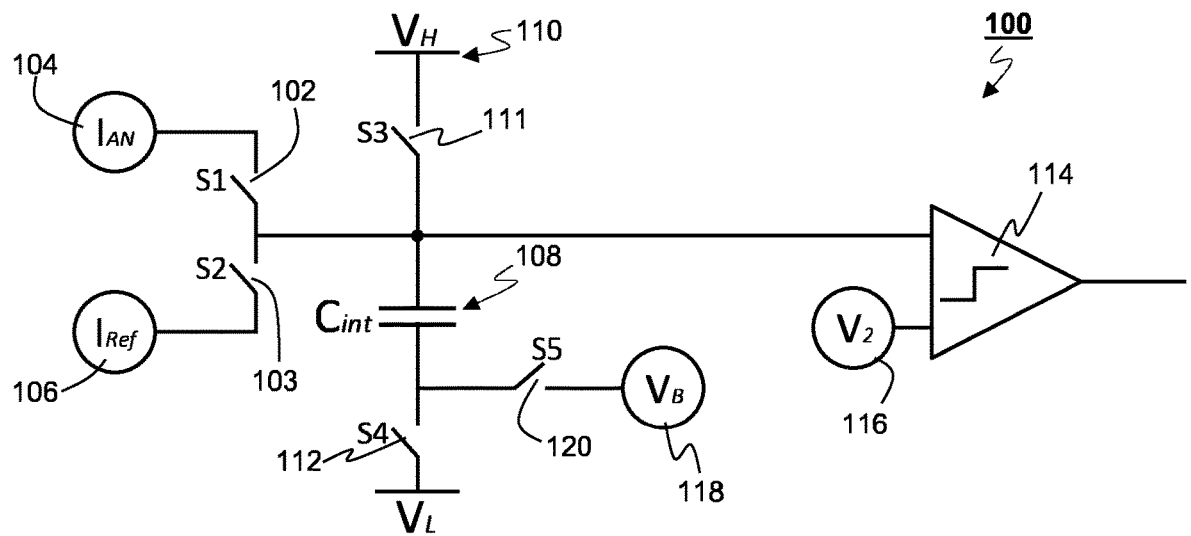
(a)
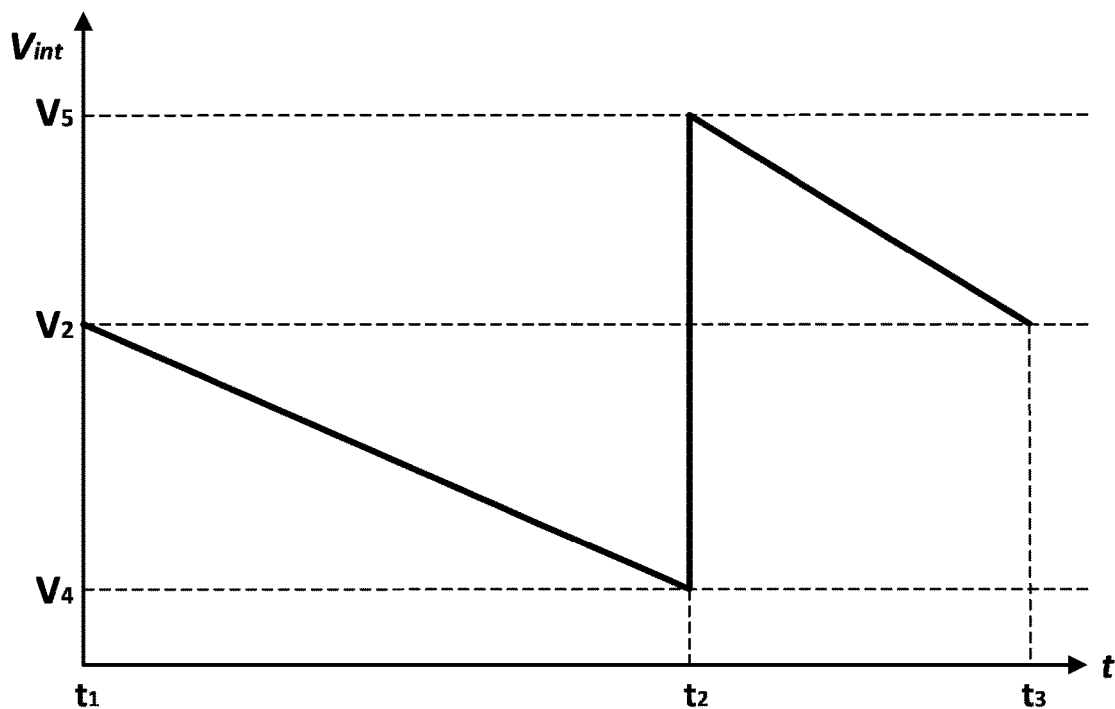
(b)
FIG. 3

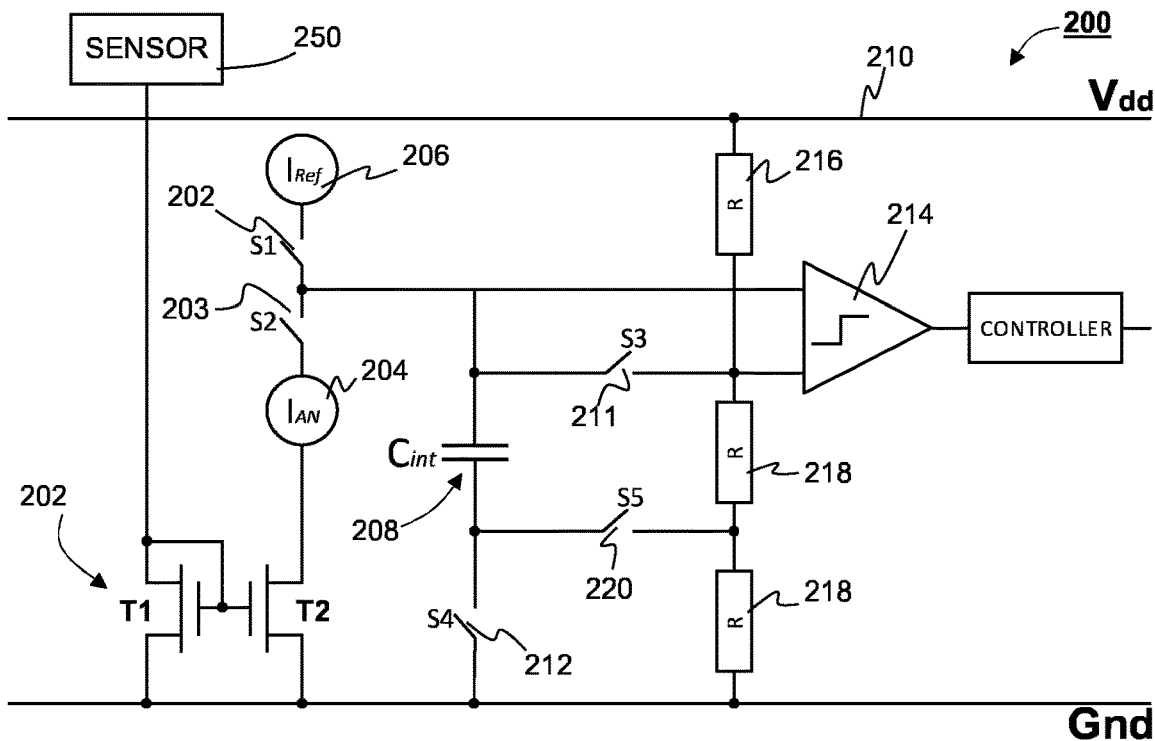
(a)
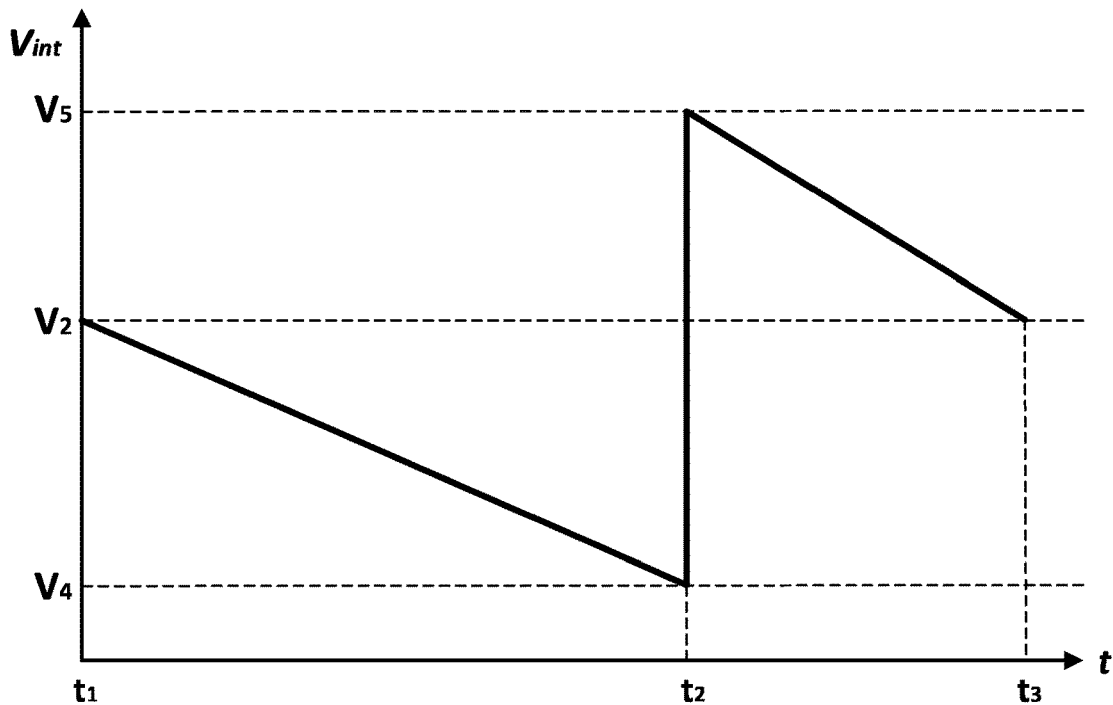
(b)
FIG. 4

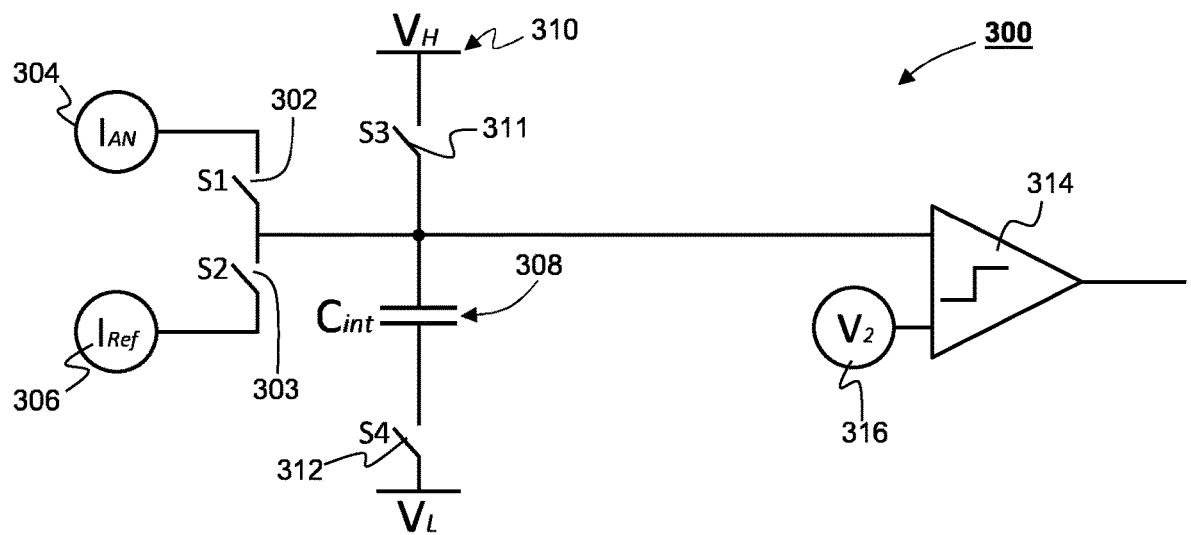
(a)
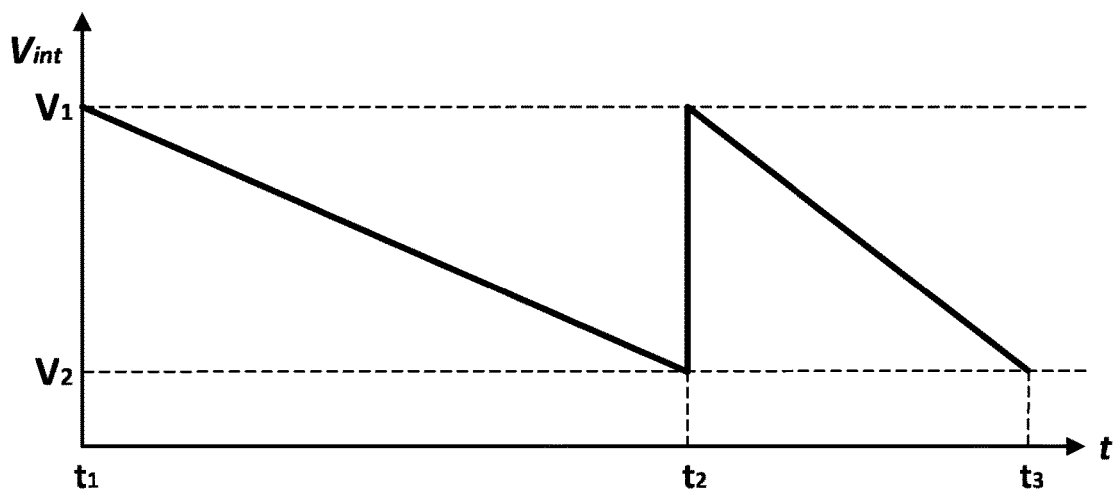
(b)
FIG. 5

$$-i_r t_{12} + CV_B - i_2 t_{23} = 0$$

$$i_2 t_{23} = CV_B - i_r t_{12}$$

$$i_2 t_{23} = CV_B - i_r t_{12}$$

$$i_2 = \frac{CV_B - i_r t_{12}}{t_{23}}$$

$$-i_r t_{12} = -i_2 t_{23}$$

$$i_2 = -\frac{i_r t_{12}}{t_{23}}$$

ANALOGUE-TO-DIGITAL CONVERTER (ADC)

CROSS-REFERENCE TO RELATED APPLICATIONS

This application is a national stage application under 35 U.S.C. 371 of PCT Application No. PCT/GB2020/050685 having an international filing date of 17 Mar. 2020, which designated the United States, which PCT application claimed the benefit of Great Britain Application No. 1904931.1, filed 8 Apr. 2019, each of which are incorporated herein by reference in their entirety.

The present invention generally relates to Analogue-to-Digital Converters (ADCs) and, in particular, to an integrating Analogue-to-Digital converter, such as, a dual-slope ADC for effecting a digital output signal from an analogue signal provided to the ADC input. Even more particularly, the present invention relates to a dual-slope ADC suitable for manufacture in a unipolar semiconductor process.

INTRODUCTION

Analogue-to-Digital Converters (ADCs) are ubiquitous in modern electronics devices, for example in performing sensing or measurement functions, as most real-world signals are analogue in nature, i.e. they are continuous-time and continuous-valued signals. So, an ADC is a device that converts such a continuously-varying input signal into a discretely-varying digital output signal.

There are many different ways of converting an analogue signal into a digital output, as is reflected by the available number of different ADC types of contrasting benefits and drawbacks. In typical ADCs, there is usually a trade-off between the ADC's conversion speed and its resolution (i.e. the number of discrete values the ADC can produce over the range of the analogue values), so the ADC is either very fast or has a high resolution (high bit level).

Also, many ADCs include relatively complex circuits, and most are based upon the prevailing CMOS IC manufacturing processes (Complementary Metal-Oxide-Semiconductor Integrated Circuit). However, when manufacturing low-cost ICs manufactured in a unipolar process, such as, for example, NMOS (N-type Metal-Oxide-Semiconductor) or PMOS (P-type Metal-Oxide-Semiconductor), the available options for producing suitable ADC circuits are considerably more narrow.

Referring now to FIG. 1, one well-known type of ADC is the dual-slope or integrating ADC 10. The method of conversion involves integrating a current directly related to an unknown voltage for a fixed period of time, followed by the integration of a standard current related to a reference voltage of opposite polarity until the integrator returns to its starting voltage.

As shown in FIG. 1, an electronic switch 12, controlled by controller 13, selects the circuit's input as the unknown analogue voltage $V_{in}$ or a reference voltage $V_{ref}$. At the initial condition, a counter 14 is reset and then switch 12 selects the unknown analogue voltage $V_{in}$ to the integrator 16. The counter 14 is enabled when the output of the comparator 18 is zero (or a predetermined starting voltage V1) to count for a fixed time interval $t_1$ to $t_2$. This produces a ramp in integrator voltage $V_{int}$ from the starting voltage $V_1$ to voltage $V_2$ over time interval $t_1$ to $t_2$. At the end of the time interval $t_1$ to $t_2$, it then integrates an internal reference signal $V_{ref}$ of known magnitude and opposite polarity, until the integrator output is reduced to its starting voltage $V_1$, occurring at time $t_3$. Since both time durations (i.e. $t_1$ to $t_2$, $t_2$ to $t_3$) and the reference signal $V_{ref}$ are accurately known, the input signal $V_{in}$ can be calculated.

In the example shown in FIG. 1, the integrator 16 is provided by an Operational Amplifier integrator (Op Amp and feedback capacitor), but the integrator may alternatively take the form of a simple integrating capacitor that is charged and discharged with analogue and reference currents analogue $I_{in}$ and $I_{ref}$ respectively. Changes in integrator voltage $dV_{int}$ are then described by the capacitor charging equation:

$$dV_{Int} = I \cdot \frac{dt}{C}, \quad\quad\quad (Eq.\ 1)$$

where I is the charging or discharging current, dt is the time interval, and C is the integrating capacitor.

A dual-slope ADC (e.g. ADC 10) has several important advantages, (i) it has a linear response (i.e. output is proportional to the input), (ii) it may be implemented using relatively simple circuits (ICs), and (iii) it is adapted to utilise readily-available quantities to perform the required calculation(s). Furthermore, the absolute accuracies of the times and voltages used in the calculation(s) do not affect the accuracy of the measurement, as the timer (i.e. clock) is merely required to run at a constant rate (frequency) throughout both time intervals, i.e. $t_1$ to $t_2$ and $t_2$ to $t_3$. Similarly, the integrator voltage threshold detecting means (e.g. the comparator 18) simply needs to determine when the integrator output voltage has returned to its starting value $V_1$. The actual values of the reference signal $V_{ref}$, as well as, the predetermined time interval $t_1$ to $t_2$ may be chosen so as to provide the desired compromise of amplitude resolution, time resolution and input signal range.

Despite all the advantages provided by a dual-slope ADC, including its potential suitability for low cost ICs, currently available dual-slope ADC's have a major drawback, as the generation of the linear upward and downward ramps in integrator voltage demands both, NMOS and PMOS devices in the circuit. Whilst this does not provide any problems for CMOS ICs, unipolar manufacturing processes used for low-cost ICs may only provide either NMOS, i.e. voltage 'pull-down', or PMOS, i.e. voltage 'pull-up', transistors, but not both. In NMOS circuits, the output is 'pulled up' towards the supply voltage by either a resistive load or another NMOS transistor load. However, 'pulling' the integrator voltage upwards by either of these loads, and thereby charging the integrating capacitor, would not provide a linear voltage ramp. Hence, there is currently no dual-slope ADC based on a unipolar process, i.e. either NMOS or PMOS.

Accordingly, it is an object of the present invention to provide a unipolar Analogue-to-Digital Converter (ADC) based on either NMOS or PMOS, therefore, allowing a simplified device, as well as, a more cost-effective manufacturing process.

SUMMARY OF THE INVENTION

Preferred embodiment(s) of the invention seek to overcome one or more of the disadvantages of the prior art.

According to a first embodiment of the invention, there is provided a dual-slope analogue-to-digital converter (ADC), comprising:

an input signal terminal, configured to provide an analogue signal, and a reference signal terminal, configured to provide a predetermined reference signal;

an integrator, operatively coupled to said input signal terminal and said reference signal terminal via a first switch unit, said first switch unit being configured to selectively connect and disconnect said integrator to and from any one of said input signal terminal and said reference signal terminal;

a voltage supply, operatively coupled to said integrator and configured to selectively provide at least one first supply voltage to said integrator via a second switch unit;

a comparator, operatively coupled to an output of said integrator at a first comparator input and a predetermined threshold voltage at a second comparator input, configured to provide an actuation signal at a comparator output in accordance with a predetermined comparator logic;

a controller, adapted to control any one of said first switch unit and said second switch unit, and said ADC being adapted to provide a first voltage to said integrator from said voltage supply, so as to integrate over a first time period a first current corresponding to one of said reference signal and said analogue signal, and, following said first time period, to provide a second voltage to said integrator from said voltage supply, so as to integrate over a second time period a second current corresponding to the other one of said reference signal and said analogue signal, in order to generate a digital output signal corresponding to said analogue signal, and wherein said first current and said second current flow in the same direction during respective said first time period and said second time period.

This provides the advantage that a single transistor type (i.e. NMOS or PMOS) may be used to provide a fully functional dual-slope ADC, using two voltage ramps over respective time intervals to digitize an unknown analogue input signal. Further, the present invention allows for a simplified manufacturing process, because only one type of semiconductor type has to be provided during fabrication, therefore, making the process faster and more cost effective.

Advantageously, said voltage supply may be configured to selectively provide at least one second supply voltage to said integrator adapted to change an existing voltage of said integrator to said second voltage.

In one embodiment, said first voltage may be equivalent to said second voltage. Preferably, said first time period may be defined by said threshold voltage.

Alternatively, said first voltage may be different to said second voltage.

Advantageously, said first time period may be defined by a predetermined value. Preferably, said second time period may be defined by said threshold voltage.

Advantageously, said threshold voltage may be equivalent to said first voltage.

Advantageously, said first switch unit may comprise a first switch, operatively coupled between said reference signal terminal and said integrator, and a second switch operatively coupled between said input signal terminal and said integrator. Preferably, each one of said first switch and said second switch may be a Field-Effect-Transistor of a first type Advantageously, said second switch unit may comprise a third switch, configured to selectively provide said first supply voltage to said integrator, a fourth switch, configured to provide a third supply voltage to said integrator, and at least a fifth switch, configured to selectively provide said second supply voltage to said integrator. Preferably, each one of said third switch, said fourth switch and at least said fifth switch may be a Field-Effect-Transistor of a first type.

Advantageously, said first type may be NMOS. Even more advantageously, each one of said analogue signal and said predetermined reference signal may be a current sink.

Alternatively, said first type may be PMOS. Advantageously, each one of said analogue signal and said predetermined reference signal may be a current source.

Advantageously, said controller may comprise a timer, operatively coupled to said comparator, and adapted to provide an oscillating signal of a predetermined frequency.

BRIEF DESCRIPTION OF THE DRAWINGS

Preferred embodiments of the present invention will now be described, by way of example only and not in any limitative sense, with reference to the accompanying drawings, in which:

FIG. 1 (Prior Art) shows (a) a simplified schematic block diagram of a known dual-slope Analogue-to-Digital Converter (ADC) using an integrator OpAmp and (b) a corresponding integrator voltage $V_{int}$ output over respective time periods;

FIG. 2 shows (a) a simplified schematic block diagram of a first embodiment of the ADC of the present invention and (b) a corresponding integrator voltage $V_{int}$ output over respective time periods when operated in a first mode;

FIG. 3 shows (a) the simplified schematic block diagram of the ADC shown in FIG. 2 and (b) a corresponding integrator voltage $V_{int}$ output over respective time periods when operated in a second mode;

FIG. 4 shows (a) a simplified schematic block diagram of an alternative embodiment of the ADC of the present invention and (b) a corresponding integrator voltage $V_{int}$ output over respective time periods when operated in the second mode, and FIG. 5 shows (a) a simplified schematic block diagram of yet another alternative embodiment of the ADC of the present invention and (b) a corresponding integrator voltage $V_{int}$ output over respective time periods when operated in the first mode.

DETAILED DESCRIPTION OF THE PREFERRED EMBODIMENT(S)

Figure 6:
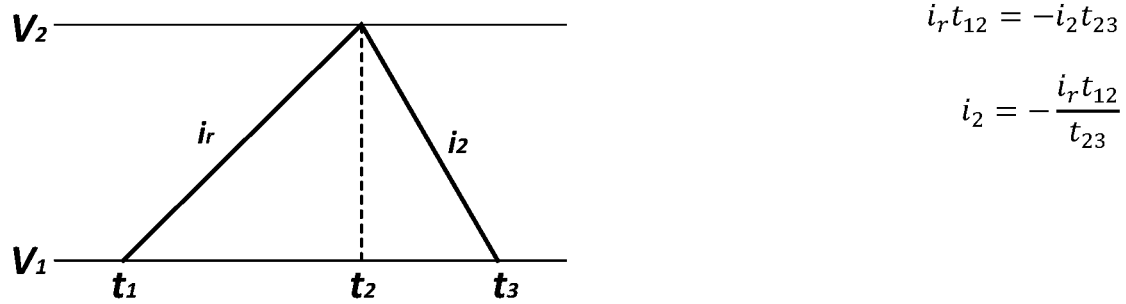
FIG. 6 shows one way to determine the unknown current $i_2$.

The exemplary embodiments of this invention will be described in relation to dual-slope Analogue-to-Digital Converters (ADCs), and in particular to dual-slope ADCs using N-type Metal-Oxide-Semiconductor circuits with an integrating capacitor.

However, it is understood by a person skilled in the art that that any other suitable integrator may be used. Further, it is understood by the person skilled in the art that P-type Metal-Oxide-Semiconductor circuits are equally suitable to provide the characterising feature of the invention, that is, currents flowing from or to the integrator are in the same direction for corresponding analogue and reference signal.

Also, it is understood that the scope of the invention is not limited only to the structure of the described example embodiment(s).

In addition, controllers and counters used for the operation of common dual-slope ADCs are well known in the art and are not described in any more detail. Therefore, controller and counter units, as well as, any other logic circuit that usually provided at the output of the comparator 114 (i.e. threshold detector) are not included in the accompanying schematics of the ADCs of the present invention but are assumed to be an operative part of any one of the described ADCs of the present invention.

Referring now to FIG. 2, there is illustrated a first embodiment of a low-cost linear dual-slope, or integrating, ADC 100 that utilises, for example, Field-Effect-Transistors (FETs) in a unipolar process (e.g. NMOS) for at least the first switch 102 and the second switch 103 between respective signal input terminal 104 and reference input terminal 106 and the integrator 108.

From the schematic block diagram in FIG. 2, the ADC 100 comprises, inter alia, an integrating capacitor $C_{int}$ (i.e. integrator 108) that is connected to a voltage supply rail 110 between a first voltage source $V_H$ via a third switch 111 and a second voltage source $V_L$ via a fourth switch 112. In this particular example, the voltage level of the first voltage source $V_H$ is higher than the voltage level of the second voltage source $V_L$, but it is understood that any suitable voltage level may be applied to the integrator 108. Further, the terms "higher" and "lower" are understood in connection with voltage levels provided by the voltage supply rail 110, which is configured to provide at least one voltage source, i.e. $V_H$ or $V_{dd}$, that is at a higher voltage level than the other voltage source, i.e. $V_L$ or Gnd, provided by the voltage supply rail 110.

The signal input terminal 104 and the reference input terminal 106 are operably coupled to the integrator 108 via respective first and second switch 102, 103, and an output of the integrator 108 (i.e. the upper plate of the capacitor) is further coupled to an input of a comparator 114 which also has a predetermined threshold voltage 116 as its second input ($V_2$).

A third voltage source 118 is operably connected to the integrator 108 (e.g. the lower plate of the capacitor $C_{int}$) via a fifth switch 120 and which is configured to selectively provide a 'boost' voltage ($V_B$) 118 so as to change the voltage level of the integrator 108, for example, back to the starting voltage $V_1$.

During use (i.e. in NMOS configuration), the analogue signal to be sensed or measured may be applied to the signal input terminal 104 as a sink current $I_{AN}$. In the event the analogue signal $I_{AN}$ is provided from a sensor 250 (see FIG. 4(a)) that does not have a current (sink) output, the analogue signal may be converted into a sink current first before it is applied to the integrator 108 via the first switch 102. In addition to the analogue signal, a known reference current $I_{Ref}$ is applied to the reference input terminal 106, either from an external reference or directly generated in the IC. The reference current $I_{Ref}$ is also applied to the integrator 108 (e.g. upper plate of the capacitor $C_{int}$) as a sink current via the second switch 103.

A first mode of operation is now described with reference to FIGS. 2(a) and 2(b), which shows the integrator voltage output $V_{int}$ over time.

At the start, the first 102, second 103 and fifth switch 120 are in an open configuration, and the third 111 and fourth switch 112 are in a closed configuration, so as to charge integrator 108 between the first (higher) voltage source $V_H$ and the second (lower) voltage source $V_L$. The charging process produces a high (starting) voltage $V_1$ across the integrating capacitor $C_{int}$. In this particular example, $V_1 = V_H - V_L$. At time $t_1$, third switch 111 is then opened and second switch 103 is closed, resulting in a discharge of the integrator 108 (e.g. upper plate of $C_{int}$) to the reference current sink $I_{Ref}$ at a first linear rate.

The duration of this linear discharge is then timed by a counter or timer circuit provided with the IC (not shown) until the comparator 114 (i.e. threshold detector) senses that the voltage of the integrator 108 (e.g. the upper plate of $C_{int}$) has reached threshold voltage $V_2$. At this time, i.e. $t_2$, the second switch 103 and the fourth switch 112 are opened, and the fifth switch 120 is closed. This configuration connects integrator 108 (e.g. the lower plate of capacitor $C_{int}$) to the third voltage source 118 so as to provide a 'boost' voltage $V_B$.

In case the 'boost' voltage $V_B$ is chosen such that $V_B = (V_1 - V_2)$, then the voltage of the integrator 108 (e.g. the voltage at the upper plate of capacitor $C_{int}$) is quickly raised back to $V_1$, as $V_2 + (V_1 - V_2) = V_1$. At this point (i.e. $t_2$ in the timing diagram of FIG. 2(b)), first switch 102 is closed, resulting in a discharge of the integrator 108 (e.g. the upper plate of capacitor $C_{int}$) to the analogue current sink $I_{AN}$. The discharge is at a second linear rate corresponding to the magnitude of the analogue current sink $I_{AN}$. As with the integration of the reference current $I_{Ref}$, the duration of this discharge is timed until the comparator 114 (i.e. threshold detector) senses that the voltage of integrator 108 (e.g. voltage at upper plate of capacitor $C_{int}$) has again reached threshold voltage $V_2$. At this point, with time periods $(t_2-t_1)$ and $(t_3-t_2)$, as well as, reference current $I_{Ref}$ known, it is possible to work out the magnitude of $I_{AN}$ using the following equation:

$$I_{AN} = \frac{I_{REF} \cdot (t_2 - t_1)}{(t_3 - t_2)}; \qquad (Eq.\ 2)$$

In the voltage output $V_{int}$ diagram illustrated in FIG. 2(b), it is understood that time $t_2$, at which first switch 102 is closed, may be in reality $t_{2'}$, which includes a short delay required by any one or any combination of the components of the ADC 100 to establish the switched voltages (e.g. $V_1$) or other settling or noise reduction steps.

A second mode of operation is now described for the first embodiment with reference to FIGS. 3(a) and 3(b), which shows the integrator voltage output $V_{int}$ over time.

In this case, the first (higher) voltage source $V_H$ is equal to the threshold voltage $V_2$ 116 and the second (lower) voltage source $V_L$ is a ground reference, i.e. $V_L = 0V$.

At the start, first switch 102, second switch 103 and fifth switch 120 are in an open configuration, and third switch 111 and fourth switch 112 are in a closed configuration, establishing threshold voltage $V_2$ at the integrator 108 (i.e. integrating capacitor $C_{int}$) ($V_H - V_L = V_2$). At time $t_1$, third switch 111 is opened and second switch 103 is closed, resulting in a discharge of the integrator 108 (e.g. the upper plate of $C_{int}$) to the reference current sink $I_{Ref}$ at a first linear rate. The duration of this linear discharge period is predetermined, i.e. it is set by a timer.

At time $t_2$ (i.e. after the set time has passed), the integrator 108 (e.g. the upper capacitor $C_{int}$ plate) voltage has decreased to a voltage level $V_4$ and second switch 103 and fourth switch 112 are opened, wherein the fifth switch 112 is closed. This configuration connects the integrator 108

(e.g. the lower plate of capacitor $C_{int}$) to the third voltage source 118 so as to provide 'boost' voltage $V_B$.

The applied 'boost' voltage $V_B$ raises the integrator voltage (e.g. the voltage at upper plate of capacitor $C_{int}$) to a voltage level $V_5$. Here, $V_5=V_4+V_B$. First switch 102 may then be closed to discharge the integrator 108 (e.g. the upper plate of $C_{int}$) to the analogue current sink $I_{AN}$. The duration of the discharge is timed until the comparator 114 (i.e. threshold detector) detects when the integrator voltage (e.g. voltage at upper plate of $C_{int}$) has decreased to threshold voltage $V_2$ (e.g. at time $t_3$).

Respective time periods $t_2-t_1$ (which is pre-set) and $t_3-t_2$ (which is determined using a counter prompted by the comparator 114) are known. Voltage $V_4$ may be measured or calculated from known reference current $I_{Ref}$, known pre-set time period $t_2-t_1$ and known integrator characteristics (e.g. capacitor $C_{int}$ properties). Consequently, unknown analogue current sink $I_{AN}$ may then be calculated from voltage $V_5-V_2$, time period $t_3-t_2$ and the known integrator characteristics (e.g. capacitor $C_{int}$ properties).

It is understood by the person skilled in the art that 'boost' voltage $V_B$ and threshold voltage $V_2$ may be selected so as to provide a suitable dynamic range, as well as, convenience. In one particular example threshold voltage $V_2$ may be chosen to be half of a high supply voltage $V_{dd}$, whilst 'boost' voltage $V_B$ may be chosen to be a quarter of the same high supply voltage $V_{dd}$.

FIG. 4(a) and (b) illustrate a second, alternative embodiment of the present invention, where both voltages $V_B$ and $V_2$ are generated through suitable voltage dividers that are provided across the IC's voltage supply rail 110.

As will be apparent to those skilled in the art, other modes of operation are possible.

For example, the second embodiment shown in FIG. 4(a) provides another suitable circuit 200 for implementing the ADC of the present invention. The applied mode of operation relates closely to the second mode of operation described for the embodiment shown in FIG. 3(a).

During operation, an analogue signal is first converted from an external signal, for example, from sensor 250, to a desired current magnitude $I_{AN}$ (e.g. a current sink 204), for example by using a current mirror 202 that may be formed from transistors T1 and T2. Both, the initial high reference voltage (here $V_2$ at time $t_1$) applied to the integrator 208 (e.g. the top plate of $C_{int}$) and the voltage threshold $V_2$ for triggering the end of the second integrator 108 discharge period (i.e. at time $t_3$), are provided by a voltage divider that is formed from a resistor network comprising resistor 216 and two further resistors 218, each one of the two resistors 218 having a resistance that is equal to one half (i.e. ½) of the resistance provided by resistor 216. The resistor network is connected in series between the higher voltage source $V_{dd}$ and the lower voltage source Gnd of the voltage supply rail 210.

In this particular example, the high reference voltage ($V_2$) and voltage threshold $V_2$ is equal to one half (i.e. ½) of the potential difference between the higher and lower voltage sources, i.e. $(V_H-V_L)/2=V_{dd}/2$. In addition, the required 'boost' voltage $V_B$ is provided via fifth switch 220 by a different tap from the ADC's voltage divider. Here, $V_B$ is a quarter (i.e. ¼) of high supply $V_{dd}$. However, it is understood by the skilled person that other suitable voltage levels may be used when operating the ADC 200.

FIG. 5(a) and (b) illustrates yet another, third embodiment of the ADC of the present invention. In particular, the ADC 300 is a specific, simplified variant of the first embodiment illustrated in FIG. 2(a). This simplified approach uses the high voltage source $V_H$ to also provide the 'boost' voltage source $V_B$ directly to the integrator 308 (e.g. to the upper plate of capacitor $C_{int}$) via third switch 311.

This third embodiment 300 of the ADC of the present invention may be used in the first mode of operation, where the initial part of the cycle is similar to the cycle described for the first embodiment 100 (see FIGS. 2(a) and (b)) with $V_1$ being the initial high starting voltage at $t_1$ (provided from $V_H$ of the voltage supply rail). However, at the end of the first discharge period to current sink $I_{Ref}$ (at $t_2$), i.e. when the comparator 314 (threshold detector) senses that the voltage of the integrator 308 (e.g. the upper plate of $C_{int}$) has reached threshold voltage $V_2$ (or, when a pre-set time $t_2$ has been reached, if used in the second mode of operation), the second switch 303 and the fourth switch 312 are opened, but third switch 311 is closed, so as to connect the integrator 308 (e.g. the upper plate of capacitor $C_{int}$) to the higher voltage source $V_H$. Since $V_H=V_1$ the rest of the cycle may continue according to the first or second mode of operation (i.e. measuring the time $t_3$ when the comparator 314 senses that the voltage of the integrator 308 has reached threshold voltage $V_2$).

From the embodiments and mode of operations described, it is understood by the person skilled in the art, that the order of the discharge ramps (i.e. for $I_{Ref}$ and $I_{AN}$) is irrelevant. For example, first switch 102, 202, 302 may be closed first to discharge the integrator 108, 208, 308 to the analogue current sink $I_{AN}$, before opening second switch 103, 203, 303 to discharge the integrator 108, 208, 308 to the reference current sink $I_{Ref}$. Further, switch timings described above are simplified and delays between certain switch operations may be introduced without affecting accuracy, for example, to reduce noise, as would be appreciated by one skilled in the art. Further, as mentioned before, the various embodiments of the ADC of the present invention may be effected utilising either one of NMOS and PMOS. It is understood by the person skilled in the art that, when used with PMOS, analogue signal and reference signal will be a current source (i.e. current flowing towards the integrator). Further, the modes of operation of the various ADC embodiments described herein are illustrative and components of those modes may be mixed as desired. For example, the decision as to whether a particular integrator discharge (or charge) period is determined by a predetermined time or by detection of a voltage threshold crossing is in the hands of the circuit designer. Similarly, the choices of supply voltage(s) (e.g. $V_H$, $V_L$, $V_B$, etc.) and threshold voltage(s) ($V_2$, etc.) may be made freely within the constraints of the IC technology and wider circuit design.

It will be appreciated by persons skilled in the art that the above embodiment(s) have been described by way of example only and not in any limitative sense, and that various alterations and modifications are possible without departing from the scope of the invention as defined by the appended claims.

Calculation for the ADC are based on the conservation of the charge $$Q=CV=IT$$

For the dual-slope ADC of the prior art, it is important that the start voltage level and the end voltage level are the same (no error). The equations for determining the unknown current $i_2$ are shown in FIG. 6.

Figure 7:
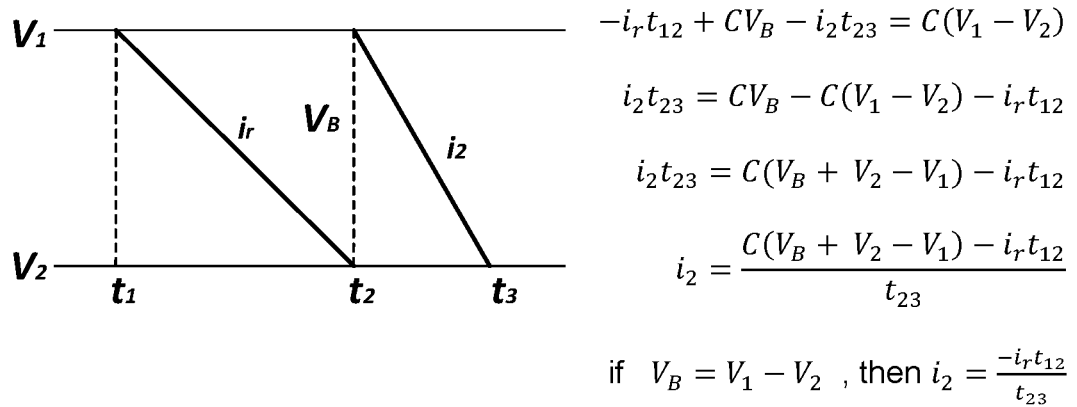
FIG. 7 shows another way to determine the unknown current $i_2$.

For dual-slope ADC of the invention (first embodiment with separate 'boost' voltage $V_B$) and when operated in the first mode operation. The equations for determining the unknown current $i_2$ are shown in FIG. 7.

Figure 8:
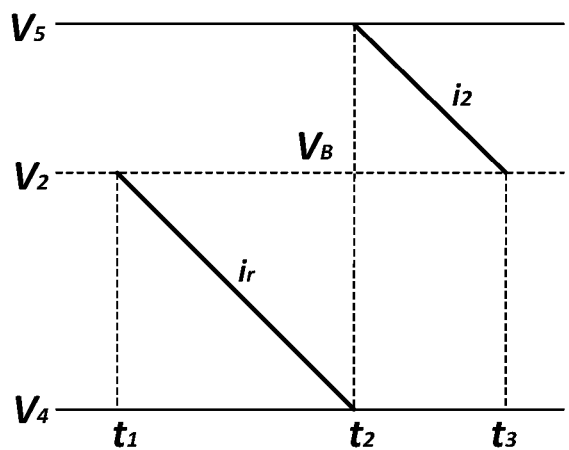
FIG. 8 shows yet another way to determine the unknown current $i_2$.

For dual-slope ADC of the invention (first embodiment with separate 'boost' voltage $V_B$) and when operated in the second mode operation. Here, an unknown $V_B$ has been introduced, which has to ensure that voltage level returns to above $V_2$. The equations for determining the unknown current $i_2$ are shown in FIG. 8.

Figure 9:
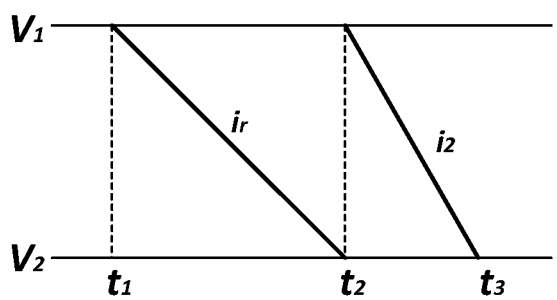
FIG. 9 shows a further way to determine the unknown current $i_2$.

For dual-slope ADC of the invention (second embodiment with 'boost' voltage $V_B$ from $V_{dd}$ via the third switch 311) and when operated in the first mode operation. In this case, $V_1$ is chosen to be a known voltage such as $V_{dd}$ making it easy to return to $V_1$. The equations for determining the unknown current $i_2$ are in FIG. 9.

The invention claimed is:

1. A dual-slope analogue-to-digital converter (ADC), comprising:
   an input signal terminal, configured to provide an analogue signal, and a reference signal terminal, configured to provide a predetermined reference signal;
   an integrator, operatively coupled to said input signal terminal and said reference signal terminal via a first switch unit, said first switch unit being configured to selectively connect and disconnect said integrator to and from any one of said input signal terminal and said reference signal terminal;
   a voltage supply, operatively coupled to said integrator and configured to selectively provide at least one first supply voltage to said integrator via a second switch unit;
   a comparator, operatively coupled to an output of said integrator at a first comparator input and a predetermined threshold voltage at a second comparator input, configured to provide an actuation signal at a comparator output in accordance with a predetermined comparator logic;
   a controller, adapted to control any one of said first switch unit and said second switch unit, and
   said ADC being adapted to provide a first voltage to said integrator from said voltage supply, so as to integrate over a first time period a first current corresponding to one of said reference signal and said analogue signal, and, following said first time period, to provide a second voltage to said integrator from said voltage supply, so as to integrate over a second time period a second current corresponding to the other one of said reference signal and said analogue signal, in order to generate a digital output signal corresponding to said analogue signal, and wherein said first current and said second current flow in the same direction during respective said first time period and said second time period.

2. A dual-slope analogue-to-digital converter (ADC) according to claim 1, wherein said voltage supply is configured to selectively provide at least one second supply voltage to said integrator adapted to change an existing voltage of said integrator to said second voltage.

3. A dual-slope analogue-to-digital converter (ADC) according to claim 1, wherein said first voltage is equal to said second voltage.

4. A dual-slope analogue-to-digital converter (ADC) according to claim 1, wherein said first time period is defined by said threshold voltage.

5. A dual-slope analogue-to-digital converter (ADC) according to claim 1, wherein said first voltage is different to said second voltage.

6. A dual-slope analogue-to-digital converter (ADC) according to claim 1, wherein said first time period is defined by a predetermined value.

7. A dual-slope analogue-to-digital converter (ADC) according to claim 1, wherein said second time period is defined by said threshold voltage.

8. A dual-slope analogue-to-digital converter (ADC) according to claim 5, wherein said threshold voltage is equal to said first voltage.

9. A dual-slope analogue-to-digital converter (ADC) according to claim 1, wherein said first switch unit comprises a first switch, operatively coupled between said reference signal terminal and said integrator, and a second switch operatively coupled between said input signal terminal and said integrator.

10. A dual-slope analogue-to-digital converter (ADC) according to claim 9, wherein each one of said first switch and said second switch is a Field-Effect-Transistor of a first type.

11. A dual-slope analogue-to-digital converter (ADC) according to claim 10, wherein said first type is NMOS.

12. A dual-slope analogue-to-digital converter (ADC) according to claim 11, wherein each one of said analogue signal and said predetermined reference signal is a current sink.

13. A dual-slope analogue-to-digital converter (ADC) according to claim 10, wherein said first type is PMOS.

14. A dual-slope analogue-to-digital converter (ADC) according to claim 13, wherein each one of said analogue signal and said predetermined reference signal is a current source.

15. A dual-slope analogue-to-digital converter (ADC) according to claim 1, said controller comprising a timer, operatively coupled to said comparator, and adapted to provide an oscillating signal of a predetermined frequency.

16. A dual-slope analogue-to-digital converter (ADC) comprising:
   an input terminal, configured to provide an analogue signal, and a reference signal terminal, configured to provide a predetermined reference signal;
   an inegrator, operatively coupled to said input signal terminal and said reference signal terminal via a first switch unit, said first switch unit being configured to selectively connect and disconnect said integrator to and from an one of said input signal terminal and said reference signal terminal;
   a voltage supply, operatively coupled to said integrator and configured to selectively provide at least one first supply voltage to said integrator via a second switch unit;
   a comparator, operatively coupled to an output of said integrator at a first comparator input and a predetermined threshold voltage at a second comparator input, configured to provide an actuation signal at a comparator output in accordance with a predetermined comparator logic;
   a controller, adapted to control any one of said first switch unit and said second switch unit, and
   said ADC being adapted to provide a first voltage to said integrator from said voltage supply, so as to integrate over a first time period a first current corresponding to one of said reference signal and said analogue signal, and, following said first time period, to provide a second voltage to said integrator from said voltage supply, so as to intergrate over a second time period a second current corresponding to the other one of said reference signal and said analogue signal, in order to generate a digital output signal corresponding to said analogue signal, and wherein said first current and said second current flow in the same direction during respective said first time period and said second time period, wherein said second switch unit comprises a third switch, configured to selectively provide said first supply voltage to said integrator, a fourth switch, configured to provide a third supply voltage to said integrator, and at least a fifth switch, configured to selectively provide said second supply voltage to said integrator.

17. A dual-slope analogue-to-digital converter (ADC) according to claim 16, wherein each one of said third switch, said fourth switch and at least said fifth switch is a Field-Effect-Transistor of a first type.

* * * * *